(12) United States Patent
Myong

(10) Patent No.: US 8,753,914 B2
(45) Date of Patent: *Jun. 17, 2014

(54) PHOTOVOLTAIC DEVICE INCLUDING FLEXIBLE OR INFLEXIBLE SUBSTRATE AND METHOD FOR MANUFACTURING THE SAME

(75) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 272 days.

This patent is subject to a terminal disclaimer.

(21) Appl. No.: 13/071,124

(22) Filed: Mar. 24, 2011

(65) Prior Publication Data

US 2012/0073636 A1    Mar. 29, 2012

(30) Foreign Application Priority Data

Mar. 26, 2010   (KR) .................. 10-2010-0027319

(51) Int. Cl.
*H01L 31/06*   (2012.01)
*H01L 31/18*   (2006.01)

(52) U.S. Cl.
USPC .............. 438/72; 136/255; 257/E31.127

(58) Field of Classification Search
None
See application file for complete search history.

(56) References Cited

U.S. PATENT DOCUMENTS

| | | | |
|---|---|---|---|
| 6,791,152 B2 | 9/2004 | Hwang et al. | |
| 7,550,665 B2 | 6/2009 | Sasaki et al. | |
| 2005/0145972 A1 | 7/2005 | Fukuda et al. | |
| 2011/0120537 A1 | 5/2011 | Liu et al. | |
| 2011/0226318 A1* | 9/2011 | Myong | 136/255 |
| 2012/0067409 A1* | 3/2012 | Myong | 136/255 |
| 2012/0279553 A1 | 11/2012 | Shigeta et al. | |
| 2013/0087200 A1 | 4/2013 | Xue et al. | |

FOREIGN PATENT DOCUMENTS

| | | |
|---|---|---|
| CN | 101593779 | 12/2009 |
| JP | 2011060971 | 3/2011 |
| KR | 100876613 | 12/2008 |

OTHER PUBLICATIONS

Notice of Allowance dated May 22, 2013 in U.S. Appl. No. 13/052,758.

* cited by examiner

*Primary Examiner* — Seahvosh Nikmanesh
(74) *Attorney, Agent, or Firm* — H.C. Park & Associates, PLC

(57) ABSTRACT

Disclosed is a method for manufacturing a photovoltaic device. The method includes: forming a first electrode on a substrate; forming a first unit cell on the first electrode; forming a portion of an intermediate reflector on the first unit cell in a first manufacturing system, the intermediate reflector including a plurality of first and second sub-layers alternately stacked; exposing to the air the substrate on which the portion of the intermediate reflector is formed; forming the rest of the intermediate reflector in a second manufacturing system, the intermediate reflector including the plurality of the first and second sub-layers alternately stacked; forming a second unit cell on the intermediate reflector; and forming a second electrode on the second unit cell.

13 Claims, 9 Drawing Sheets

US 8,753,914 B2

PHOTOVOLTAIC DEVICE INCLUDING FLEXIBLE OR INFLEXIBLE SUBSTRATE AND METHOD FOR MANUFACTURING THE SAME

CROSS-REFERENCE TO RELATED APPLICATIONS

This application claims priority under 35 U.S.C. §119 to Korean Patent Application No. 10-2010-0027319 filed on Mar. 26, 2010, the entirety of which is hereby incorporated by reference.

FIELD OF THE INVENTION

The present invention relates to a photovoltaic device including a flexible substrate or an inflexible substrate and relates to a method for manufacturing the same.

BACKGROUND OF THE INVENTION

Recently, because of a high oil price and a global warming phenomenon based on a large amount $CO_2$ emission, energy is becoming the most important issue in determining the future life of mankind. Even though many renewable energy technologies including wind force, bio-fuels, a hydrogen/fuel cell and the like have been developed, a photovoltaic device using sunlight is in the spotlight in that solar energy, the origin of all energies, is an almost infinite clean energy source.

The sunlight incident on the surface of the earth has an electric power of 120,000 TW. Thus, theoretically, if a photovoltaic device having a photoelectric conversion efficiency of 10% covers only 0.16% of the land surface of the earth, it is possible to generate electric power of 20 TW that is twice as much as the amount of energy globally consumed during one year.

Actually, the world photovoltaic market has explosively grown by almost 40% of an annual growth rate for the last ten years. Now, a bulk-type silicon photovoltaic device occupies a 90% of the photovoltaic device market share. The bulk-type silicon photovoltaic device includes a single-crystalline silicon photovoltaic device and a multi-crystalline or a polycrystalline silicon photovoltaic device and the like. However, productivity of a solar-grade silicon wafer which is the main material of the photovoltaic device is not able to fill the explosive demand thereof, so the solar-grade silicon wafer is globally in short supply. Therefore, this shortage of the solar-grade silicon wafer is a huge threatening factor in reducing the manufacturing cost of a photovoltaic device.

Contrary to this, a thin-film silicon photovoltaic device based on a hydrogenated amorphous silicon (a-Si:H) allows to reduce a thickness of a silicon layer equal to or less than $1/100$ as large as that of a silicon wafer of the bulk-type silicon photovoltaic device. Also, it makes possible to manufacture a large area photovoltaic device at a lower cost.

Meanwhile, a single-junction thin-film silicon photovoltaic device is limited in its achievable performance. Accordingly, a double junction thin-film silicon photovoltaic device or triple junction thin-film silicon photovoltaic device having a plurality of stacked unit cells has been developed, pursuing high stabilized efficiency.

The double junction or triple junction thin-film silicon photovoltaic device is referred to as a tandem-type photovoltaic device. The open circuit voltage of the tandem-type photovoltaic device corresponds to a sum of each unit cell's open circuit voltage. Short circuit current is determined by a minimum value among the short circuit currents of the unit cells.

Regarding the tandem-type photovoltaic device, research is being devoted to an intermediate reflector which is capable of improving efficiency by enhancing internal reflection between the unit cells.

SUMMARY OF THE INVENTION

An aspect of the present invention is a method for manufacturing a photovoltaic device. The method includes: forming a first electrode on a substrate; forming a first unit cell on the first electrode; forming a portion of an intermediate reflector on the first unit cell in a first manufacturing system, the intermediate reflector including a plurality of first and second sub-layers alternately stacked; exposing to the air the substrate on which the portion of the intermediate reflector is formed; forming the rest of the intermediate reflector in a second manufacturing system, the intermediate reflector including the plurality of the first and second sub-layers alternately stacked; forming a second unit cell on the intermediate reflector; and forming a second electrode on the second unit cell.

Another aspect of the present invention is a photovoltaic device. The photovoltaic device includes: a substrate; a first electrode and a second electrode which are placed over the substrate; a first unit cell placed between the first electrode and the second electrode; a second unit cell placed between the first unit cell and the second electrode; and an intermediate reflector which is placed between the first unit cell and the second unit cell, which includes a first sub-layer and a second sub-layer having mutually different crystal volume fractions, and which is composed of an n-type nanocrystalline silicon based material.

DETAILED DESCRIPTION

A method for manufacturing a photovoltaic device according to an embodiment of the present invention will be described in detail with reference to the drawings.

Figure 1A:
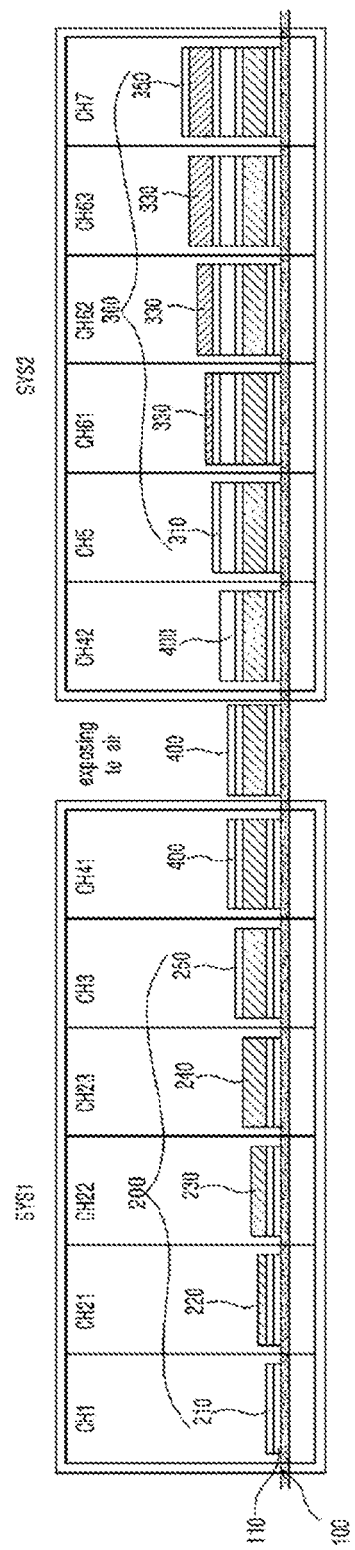
FIGS. 1a and 1b show a method for manufacturing a photovoltaic device according to an embodiment of the present invention.
Figure 1B:
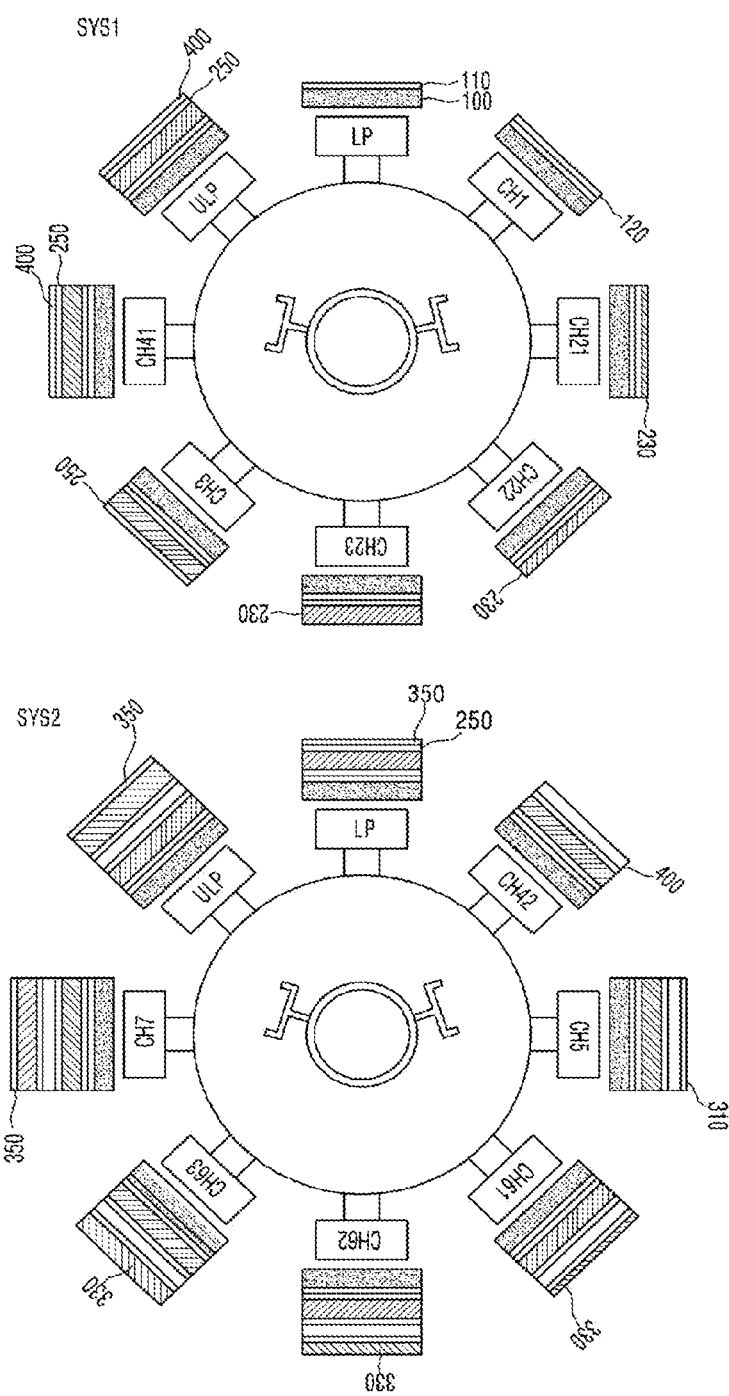

The photovoltaic device may have a double junction structure and a triple junction structure and the like. In FIGS. 1a and 1b, a photovoltaic device having a double junction structure will be described as the example thereof.

FIGS. 1a and 1b show a first manufacturing system and a second manufacturing system, which are used to manufacture a photovoltaic device according to an embodiment of the present invention. FIG. 1a shows a stepping roll type manufacturing system. FIG. 1b shows a cluster type manufacturing system. The stepping roll type manufacturing system is used to manufacture a photovoltaic device on a flexible substrate such as a metal foil or a polymer substrate. The cluster type manufacturing system is used to manufacture a photovoltaic device on an inflexible substrate such as a glass substrate.

The method for manufacturing the photovoltaic device according to the embodiment of the present invention can be applied to not only the manufacturing systems shown in FIGS. 1a and 1b but also various manufacturing system, for example, a roll-to-roll type manufacturing system.

Process chambers CH1, CH21 to CH23, CH3 and CH41 included in the first manufacturing system SYS1 are isolated from the air. Process chambers CH42, CH5, CH61 to CH63 and CH7 included in the second manufacturing system SYS2 are also isolated from the air.

As shown in FIGS. 1a and 1b, a substrate 100 is provided, which has a first electrode 110 formed thereon. A first unit cell 200 is formed in the first manufacturing system SYS1. Here, the first unit cell 200 includes a first conductive silicon layer 210, an intrinsic silicon layer 230 and a second conductive silicon layer 250, which are sequentially stacked from the first unit cell 110.

The first conductive silicon layer 210, the intrinsic silicon layer 230 and the second conductive silicon layer 250 are respectively formed in the process chamber CH1, the process chambers CH21 to CH23 and the process chamber CH3 of the first manufacturing system SYS. Since the thickness of the intrinsic silicon layer 230 is larger than the thickness of the first conductive silicon layer 210 and the thickness of the second conductive silicon layer 250, the number of the process chambers CH21 to CH23 required for forming the intrinsic silicon layer 230 may be greater than the number of the process chamber required for forming the first conductive silicon layer 210 or the second conductive silicon layer 250.

When the first conductive silicon layer 210 and the second conductive silicon layer 250 correspond to a p-type silicon layer and an n-type silicon layer respectively, hydrogen gas, silane gas and group III impurities are introduced into the process chamber CH1. Hydrogen gas, silane gas and group V impurities are introduced into the process chamber CH3. When the first conductive silicon layer 210 and the second conductive silicon layer 250 correspond to an n-type silicon layer and a p-type silicon layer respectively, hydrogen gas, silane gas and group V impurities are introduced into the process chamber CH1. Hydrogen gas, silane gas and group III impurities are introduced into the process chamber CH3. The aforementioned impurities can be introduced to form a first conductive silicon layer 310 and second conductive silicon layer 350 of a second unit cell 300.

A portion of an intermediate reflector 400 is formed on the first unit cell 200. While the portion of the intermediate reflector 400 is formed, a flow rate of gas including a non-silicon element such as oxygen, carbon or nitrogen alternately changes between a first flow rate value and a second flow rate value in accordance with a deposition time. The intermediate reflector 400 has hereby a multilayer structure including a plurality of sub-layers. Crystal volume fractions of the two adjacent sub-layers are different from each other. The gas including the non-silicon element is used to form the intermediate reflector 400 in order to control the crystal volume fraction or the refractive index of the intermediate reflector 400.

Here, the intermediate reflector 400 includes a hydrogenated nanocrystalline silicon material so as to improve its vertical electrical conductivity. An n-type hydrogenated nanocrystalline silicon material is able to more improve the vertical electrical conductivity of the intermediate reflector 400. The n-type hydrogenated nanocrystalline silicon material in the embodiment of the present invention includes an n-type hydrogenated nanocrystalline silicon oxide (n-nc-SiO:H), an n-type hydrogenated nanocrystalline silicon carbide (n-nc-SiC:H) or an n-type hydrogenated nanocrystalline silicon nitride (n-nc-SiN:H). The intermediate reflector 400 will be described in detail later in this description.

The substrate 100 on which the portion of the intermediate reflector 400 has been formed is exposed to the air. In FIGS. 1a and 1b, the first manufacturing system SYS1 and the second manufacturing system SYS2 are separated from each other. The substrate 100 on which the portion of the intermediate reflector 400 has been formed is hereby exposed to the air in order to be transferred to the second manufacturing system SYS2. Since the first manufacturing system SYS1 is separated from the second manufacturing system SYS2, prices of the first manufacturing system SYS1 and the second manufacturing system SYS2 are reduced, so that the manufacturing cost of the photovoltaic device can be reduced. If the first manufacturing system SYS1 is not separated from the second manufacturing system SYS2, the first manufacturing system SYS1 and the second manufacturing system SYS2 should be in a vacuum state without an air exposure section. Accordingly, the price of the manufacturing system increases. When the first manufacturing system SYS1 is separated from the second manufacturing system SYS2, it is possible both to apply the manufacturing systems SYS1 and SYS2 more variously and to efficiently utilize a space in which the manufacturing systems SYS1 and SYS2 are installed.

A flow rate of the gas including the non-silicon element vary between a third flow rate value and a fourth flow rate value in accordance with a deposition time, so that the rest of the intermediate reflector 400 is formed in the process chamber CH42 of the second manufacturing system SYS2. Like the portion of the intermediate reflector 400 as described above, the rest of the intermediate reflector 400 has a multilayer structure including a plurality of sub-layers. Crystal volume fractions of the two adjacent sub-layers are different from each other.

As described above, the intermediate reflector 400 includes the n-type hydrogenated nanocrystalline silicon material for the purpose of improving the vertical electrical conductivity of the intermediate reflector 400. Therefore, group V impurity is introduced into the process chambers CH41 and CH42 at the time of forming the intermediate reflector 400.

Since the substrate 100 on which the portion of the intermediate reflector 400 is formed is exposed to the air, an oxide layer may be formed on the intermediate reflector 400. The oxide layer formed by exposing the substrate to the air may reduce the efficiency of the photovoltaic device. Therefore, an etching process of the oxide layer is performed before the rest of the intermediate reflector 400 is formed in the process chamber CH42.

Here, the oxide layer can be etched in a separate process chamber or in the process chamber CH42 in which the rest of the intermediate reflector 400 is formed. When the etching process is performed in the process chamber CH42 in which the rest of the intermediate reflector 400 is formed, the structure of the second manufacturing system SYS2 becomes simpler.

In the embodiment of the present invention, the etching process may be performed by using a hydrogen plasma etching process. Since the hydrogen gas is also used to form the rest of the intermediate reflector 400, when the etching process is performed in the process chamber CH42 in which the rest of the intermediate reflector 400 is formed, it is possible to prevent a material which has been used in the etching process from affecting the formation of the intermediate reflector 400.

When the etching process is performed in the process chamber CH42 or in the separate chamber by the hydrogen plasma, impurities may be introduced. For example, in the intermediate reflector 400 composed of the n-type hydrogenated nanocrystalline silicon material, if the etching process is performed by the hydrogen plasma, the impurities included in the intermediate reflector 400 flow out, so that the electrical conductivity of the intermediate reflector 400 is reduced. Hence, by introducing the impurities during the etching process, it is possible to prevent the electrical conductivity reduction caused by the hydrogen plasma etching process.

The rest of the intermediate reflector 400 is formed, and then a second unit cell 300 is formed on the intermediate reflector 400. The second unit cell 300 includes a first conductive silicon layer 310, an intrinsic silicon layer 330 and a second conductive silicon layer 350. The first conductive silicon layer 310, the intrinsic silicon layer 330 and the second conductive silicon layer 350 of the second unit cell 300 are respectively formed in the process chamber CH5, the process chambers CH61 to CH63 and the process chamber CH7.

Here, when the second conductive silicon layer of a unit cell on which light is first incident among the first unit cell 200 and the second unit cell 300 is composed of an n-type nanocrystalline silicon, the thickness of the second conductive silicon layer is equal to or larger than 5 nm and equal to or less than 30 nm. In order that the second conductive silicon layer performs its function, the thickness of the second conductive silicon layer is equal to or larger than 5 nm. Further, when the thickness of the second conductive silicon layer is equal to or less than 30 nm, light is prevented from being excessively absorbed by the second conductive silicon layer due to the thickness increase of the second conductive silicon layer.

Meanwhile, when the pressure of the process chamber CH42 is maintained constant, the removal of the oxide layer, the formation of the rest of the intermediate reflector 400 and the formation of the first conductive silicon layer 310 of the second unit cell 300 can be performed within the one process chamber CH42.

In the stepping roll type manufacturing system or the roll-to-roll type manufacturing system, the intermediate reflector 400 can be formed in a plurality of process chambers in accordance with the thickness of the intermediate reflector 400.

Next, a method for manufacturing the intermediate reflector 400 will be described in detail with reference to the drawings.

Figure 2:
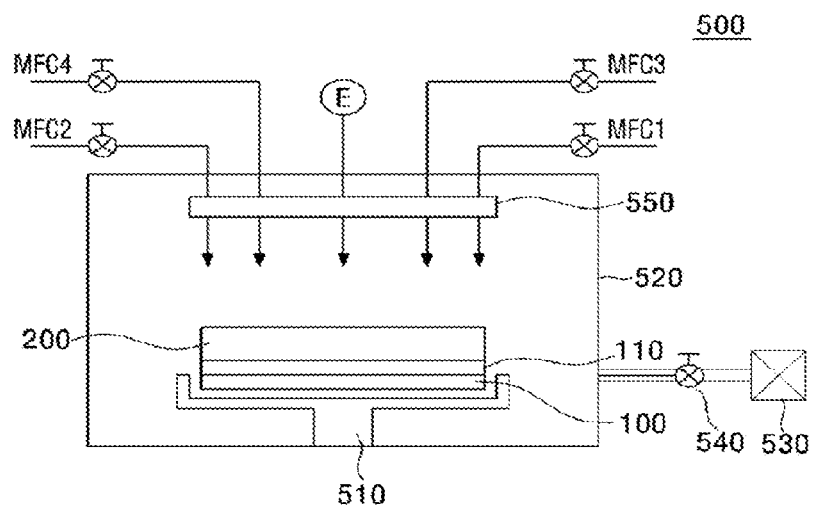
FIG. 2 shows an example of a plasma-enhanced chemical vapor deposition apparatus for forming an intermediate reflector in accordance with the embodiment of the present invention.

FIG. 2 shows an example of a plasma-enhanced chemical vapor deposition apparatus for forming the intermediate reflector in accordance with an embodiment of the present invention. As shown in FIG. 2, the substrate 100 on which the first electrode 110 and the first unit cell 200 are formed is placed on a plate 510 functioning as an electrode. The first unit cell 200 may include the first conductive silicon layer 210, the intrinsic silicon layer 230 and the second conductive silicon layer 250, which are sequentially stacked.

Here, when the second conductive silicon layer 250 includes an n-type hydrogenated nanocrystalline silicon (n-nc-Si:H), silane gas ($SiH_4$), hydrogen gas ($H_2$) and phosphine gas ($PH_3$) may be introduced into the process chamber 520. When the second conductive silicon layer 250 includes a p-type hydrogenated nanocrystalline silicon (p-nc-Si:H), diborane gas ($B_2H_6$) as well as silane gas ($SiH_4$) and hydrogen gas ($H_2$) may be introduced into the process chamber 520.

After the second conductive silicon layer 250 including the hydrogenated nanocrystalline silicon is formed, the flow rates of the silane gas, hydrogen gas and impurity gas which are introduced into the process chamber 520 are maintained. A substrate temperature and process pressure, etc., of the process chamber 520 are maintained. Then, gas including the non-silicon element is introduced into the process chamber 520.

Here, since the flow rates of the gases, substrate temperature and process pressure, etc., are maintained in the process chamber 520 and the gas including the non-silicon element is introduced into the process chamber 520, both the second conductive silicon layer 250 of the first unit cell 200 and the intermediate reflector 400 can be formed in the same process chamber 520. That is, the second conductive silicon layer 250 and the portion of the intermediate reflector 400 can be formed in one process chamber, while FIGS. 1a and 1b show that the second conductive silicon layer 250 and the portion of the intermediate reflector 400 are respectively formed in the process chamber CH3 and the process chamber CH41.

As shown in FIG. 2, the hydrogen gas, silane gas and impurity gas are introduced into the process chamber 520 through mass flow controllers MFC1 to MFC3 and an electrode 550 having nozzles formed therein.

Additionally, the gas including the non-silicon element is introduced into the process chamber 520 through a mass flow controller MFC4 and nozzle of the electrode 550. When the non-silicon element is oxygen, the gas including the non-silicon element may include $O_2$ or $CO_2$. When the non-silicon element is carbon, the gas including the non-silicon element includes $CH_4$, $C_2H_4$ or $C_2H_2$. When the non-silicon element is nitrogen, the gas including the non-silicon element includes $NH_4$, $N_2O$ or NO.

Here, an angle valve 540 is controlled to maintain the pressure of the process chamber 520 constant. A pump 530 supplies a suction force for exhausting the gases. That is, when the flow rates of the gases introduced through the mass flow controllers MFC1 to MFC4 are the same as those of the gases flown out through the angle valve 540, the pressure of the process chamber 520 is maintained constant. When the pressure of the process chamber 520 is maintained constant, it is prevented that silicon powder is generated by occurrence of turbulence within the process chamber 520, and a deposition condition is maintained constant. The hydrogen gas is introduced to dilute the silane gas and reduces Staebler-Wronski effect.

When the said gases and the gas including the non-silicon element are introduced and a power source E provides voltage, an electric potential difference between the electrode 550 and the plate 510 makes the gases within the process chamber 520 become in a plasma state and then the portion of the intermediate reflector 400 is formed on the hydrogenated nanocrystalline silicon of the first unit cell 200.

When gas including oxygen, carbon or nitrogen is introduced, the intermediate reflector 400 includes a hydrogenated nanocrystalline silicon oxide (nc-SiO:H), a hydrogenated nanocrystalline silicon carbide (nc-SiC:H) or a hydrogenated nanocrystalline silicon nitride (nc-SiN:H).

As such, the intermediate reflector 400 includes the hydrogenated nanocrystalline silicon based material similar to the hydrogenated nanocrystalline silicon of a unit cell on which light is first incident. Therefore, the intermediate reflector 400 is easily bonded to the unit cell on which light is first incident.

In the embodiment of the present invention, the gas including oxygen, carbon or nitrogen is introduced into the process chamber 520 in accordance with flow rate change shown in FIGS. 3 to 6b. Here, the gas introduced in accordance with the flow rate change shown in FIGS. 3 to 6b can be used to form not only the portion of the intermediate reflector 400 but also the rest of the intermediate reflector 400.

Figure 3:
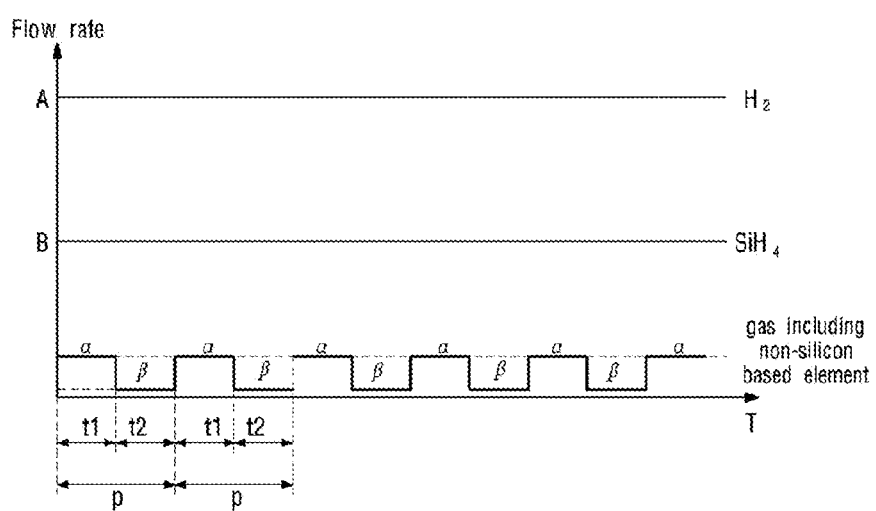
FIGS. 3 to 6b show flow rate changes of gas including a non-silicon element for forming the intermediate reflector in accordance with the embodiment of the present invention.

As shown in FIG. 3, a flow rate "A" of the hydrogen and a flow rate "B" of the silane are constant in accordance with the elapsed deposition time T. A flow rate of the gas including the non-silicon element alternately varies between a first flow rate value "α" and a second flow rate value "β" in accordance with the elapsed deposition time T. The first flow rate value "α" and the second flow rate value "β" are constant in accordance with the elapsed deposition time T. That is, in every cycle P, the first flow rate value "α" and the second flow rate value "β" are maintained constant.

Here, during one cycle P derived from a sum of a duration time of the first flow rate value "α" and a duration time of the second flow rate value "β", a duration time t1 of the first flow rate value "α" and a duration time t2 of the second flow rate value "β" are maintained constant in accordance with the elapsed deposition time T.

Figure 4A:
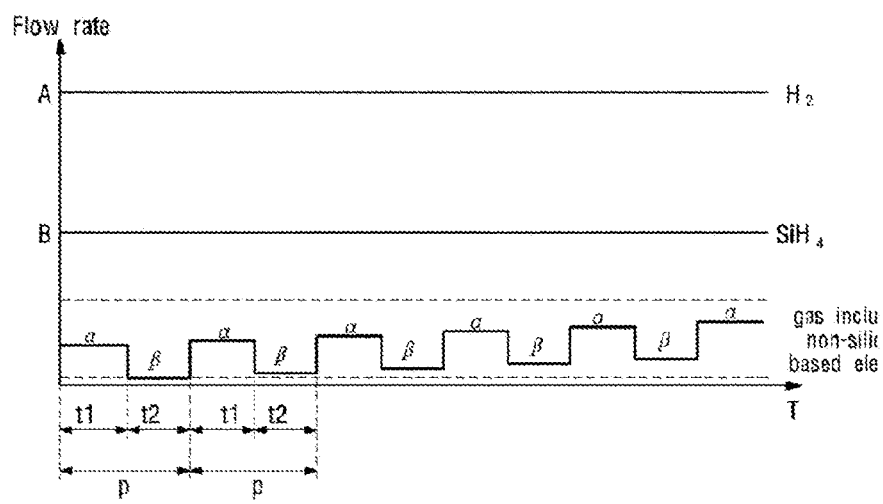
Figure 4B:
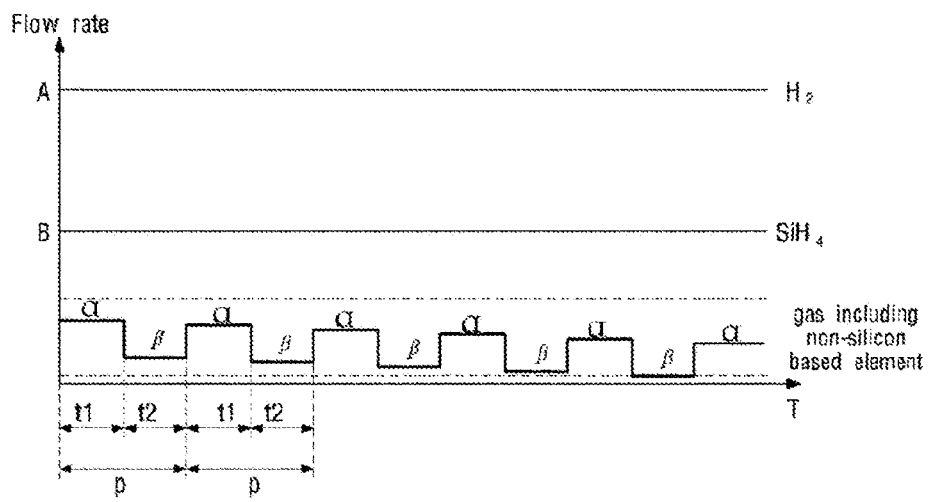

In the embodiment of the present invention, as shown in FIGS. 4a and 4b, the flow rate of the gas including the non-silicon element changes. Like the flow rate change of FIG. 3, the flow rate "A" of the hydrogen and the flow rate "B" of the silane are constant in accordance with the elapsed deposition time T. The flow rate of the gas including the non-silicon element alternately varies between the first flow rate value "α" and the second flow rate value "β" in accordance with the elapsed deposition time T. In a flow rate change of FIG. 4a, the first flow rate value "α" and the second flow rate value "β" gradually increase in accordance with the elapsed deposition time T. In a flow rate change of FIG. 4b, the first flow rate value "α" and the second flow rate value "β" gradually decrease in accordance with the elapsed deposition time T. Here, during one cycle P derived from a sum of a duration time of the first flow rate value "α" and a duration time of the second flow rate value "β", a duration time t1 of the first flow rate value "α" and a duration time t2 of the second flow rate value "β" are maintained constant in accordance with the elapse of deposition time T.

Though not shown in the drawings, one of the first flow rate value "α" and the second flow rate value "β" may increase or decrease in accordance with the elapsed deposition time T, and the other may be maintained constant in accordance with the elapsed deposition time T.

Figure 5A:
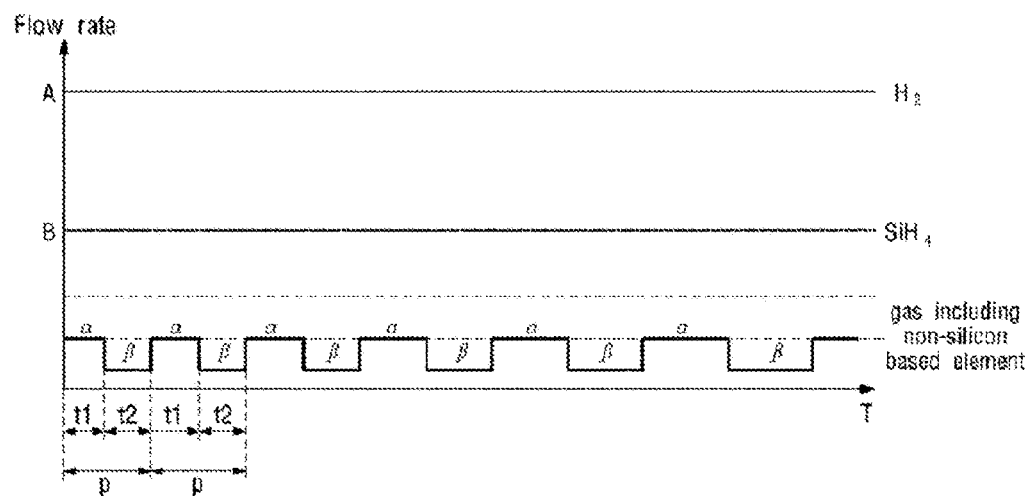
Figure 5B:
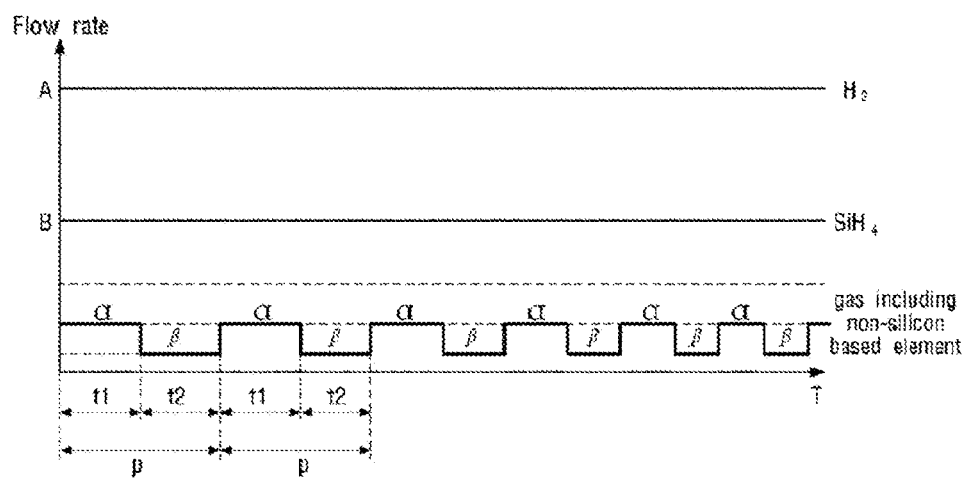

The flow rate of the gas including the non-silicon element may change as shown in FIGS. 5a to 5b. That is, the flow rate "A" of the hydrogen and the flow rate "B" of the silane are constant in accordance with the elapsed deposition time T. The flow rate of the gas including the non-silicon element alternately changes between the first flow rate value "α" and the second flow rate value "β" in accordance with the elapsed deposition time T. Additionally, the first flow rate value "α" and the second flow rate value "β" are constant in accordance with the elapsed deposition time T.

Here, as shown in FIG. 5a, during one cycle P derived from a sum of a duration time of the first flow rate value "α" and a duration time of the second flow rate value "β", a duration time t1 of the first flow rate value "α" and a duration time t2 of the second flow rate value "β" gradually increase in accordance with the elapsed deposition time T.

Also, as shown in FIG. 5b, during one cycle P derived from a sum of a duration time of the first flow rate value "α" and a duration time of the second flow rate value "β", a duration time t1 of the first flow rate value "α" and a duration time t2 of the second flow rate value "β" gradually decrease in accordance with the elapsed deposition time T.

Though not shown in the drawings, one of the duration time t1 of the first flow rate value "α" and the duration time t2 of the second flow rate value "β" may increase or decrease in accordance with the elapsed deposition time T, and the other may be maintained constant in accordance with the elapsed deposition time T.

Figure 6A:
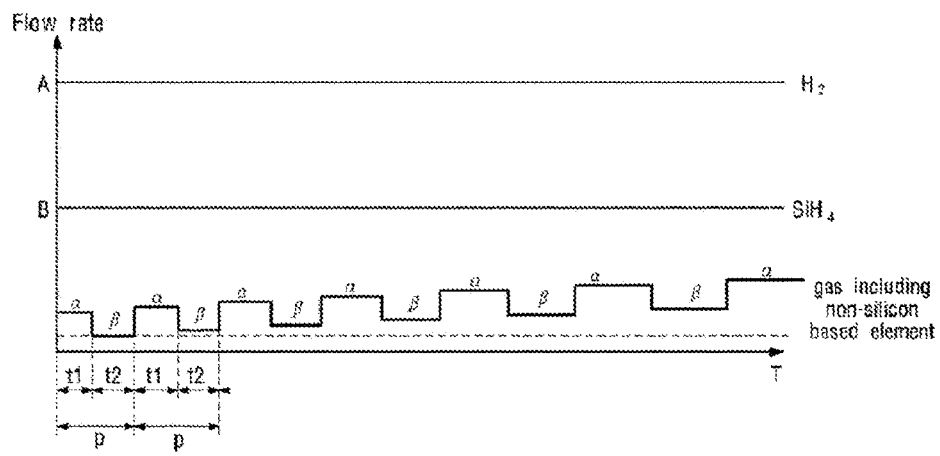
Figure 6B:
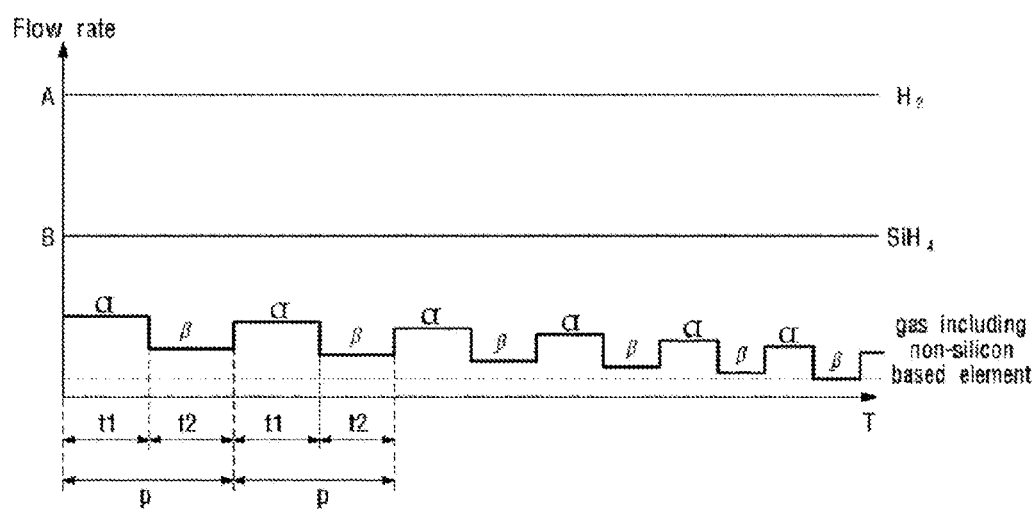

The flow rate of the gas including the non-silicon element may change as shown in FIGS. 6a and 6b. That is, the flow rate "A" of the hydrogen and the flow rate "B" of the silane are constant in accordance with the elapsed deposition time T. The flow rate of the gas including the non-silicon element alternately varies between the first flow rate value "α" and the second flow rate value "β" in accordance with the elapsed deposition time T.

Here, as shown in FIG. 6a, the first flow rate value "α" and the second flow rate value "β" gradually increase in accordance with the elapsed deposition time T. During one cycle P derived from a sum of a duration time of the first flow rate value "α" and a duration time of the second flow rate value "β", a duration time t1 of the first flow rate value "α" and a duration time t2 of the second flow rate value "β" also gradually increase in accordance with the elapsed deposition time T.

As shown in FIG. 6b, the first flow rate value "α" and the second flow rate value "β" gradually decrease in accordance with the elapsed deposition time T. During one cycle P derived from a sum of a duration time of the first flow rate value "α" and a duration time of the second flow rate value "β", the duration time t1 of the first flow rate value "α" and the duration time t2 of the second flow rate value "β" also gradually decrease in accordance with the elapsed deposition time T.

The flow rate changes in FIGS. 4a, 5a and 6a can be applied to form the intermediate reflector 400 of a p-i-n type photovoltaic device. The flow rate changes in FIGS. 4b, 5b and 6b can be applied to form the intermediate reflector 400 of an n-i-p type photovoltaic device.

The first unit cell 200 of the p-i-n type photovoltaic device includes a p-type silicon layer, an intrinsic silicon layer and an n-type silicon layer, which are sequentially stacked from the substrate 100. The second unit cell 300 of the p-i-n type photovoltaic device includes a p-type silicon layer, an intrinsic silicon layer and an n-type silicon layer, which are sequentially stacked from the intermediate reflector 400. In the p-i-n type photovoltaic device, light is incident through the first unit cell 200.

The first unit cell 200 of the n-i-p type photovoltaic device includes an n-type silicon layer, an intrinsic silicon layer and a p-type silicon layer, which are sequentially stacked from the substrate 100. The second unit cell 300 of the n-i-p type photovoltaic device includes an n-type silicon layer, an intrinsic silicon layer and a p-type silicon layer, which are sequentially stacked from the intermediate reflector 400. In the n-i-p type photovoltaic device, light is incident through the second unit cell 300.

In the p-i-n type photovoltaic device, as shown in FIGS. 4a, 5a and 6a, the first flow rate value "α" and the second flow rate value "β" increase in accordance with the elapsed deposition time T, or the duration time t1 of the first flow rate value "α" and the duration time t2 of the second flow rate value "β" increase in accordance with the elapsed deposition time T.

Accordingly, a plurality of first sub-layers 400a and a plurality of second sub-layers 400b may be formed. With respect to any two sub-layers of the first sub-layers 400a, one sub-layer formed prior to the other has smaller amount of the non-silicon element. The second sub-layers 400b are the same as the described first sub-layers 400a.

In the n-i-p type photovoltaic device, as shown in FIGS. 4b, 5b and 6b, the first flow rate value "α" and the second flow rate value "β" decrease in accordance with the elapsed deposition time T, or the duration time t1 of the first flow rate value "a" and the duration time t2 of the second flow rate value "β" decrease in accordance with the elapsed deposition time T.

Accordingly, a plurality of first sub-layers 400a and a plurality of second sub-layers 400b may be formed. With respect to any two sub-layers of the first sub-layers 400a, one sub-layer formed prior to the other has greater amount of the non-silicon element. The second sub-layers 400b are the same as the described first sub-layers 400a.

That is, the concentration of the non-silicon element such as oxygen, carbon or nitrogen which is contained in the first sub-layer 400a or the second sub-layer 400b is increased more the farther it is from a light incident side. For example, in the p-i-n type photovoltaic device, the concentration of the non-silicon element is increased more the farther it is from the first unit cell 200. In the n-i-p type photovoltaic device, the concentration of the non-silicon element is increased more the farther it is from the second unit cell 300.

When the concentration of the non-silicon element contained in the first sub-layer 400a or the second sub-layer 400b is increased more the farther it is from a light incident side, a refractive index gradually changes at the interface between the intermediate reflector 400 and the unit cell on which light is first incident, so that the amount of reflected light may increase.

In the flow rate changes in FIGS. 3 to 6b, the second flow rate value "β" less than the first flow rate value "α" is greater than or equal to 0. When the second flow rate value "β" is 0, a hydrogenated nanocrystalline silicon (nc-Si:H) is formed during the duration time t2 of the second flow rate value "β".

The flow rate changes in FIGS. 3 to 6b can be applied to not only the formation of a portion of the intermediate reflector 400 but also the formation of the rest of the intermediate reflector 400. Here, a third flow rate value and a fourth flow rate value of the gas including the non-silicon element used to form the rest of the intermediate reflector 400 may or may not be equal to the first flow rate value "α" and the second flow rate value "β" respectively. In addition, while the gas at the first flow rate value "α" greater than the second flow rate value "β" is first supplied to form the portion of the intermediate reflector 400, the gas at the fourth flow rate value less than the third flow rate value may be first supplied to form the rest of the intermediate reflector 400.

Though FIGS. 3 to 6b do not show the flow rate change of the impurity, the flow rate of the impurity in the embodiment of the present invention is constant in accordance with the elapsed deposition time T. Therefore, as described in FIGS. 3 to 6b, in the embodiment of the present invention, the flow rate "A" of the hydrogen, the flow rate "B" of the silane and the flow rate of the impurity are constant in accordance with the elapsed deposition time T.

The flow rate changes of FIGS. 3 to 6b can be applied to a manufacturing system including process chambers separated from each other, for example, the stepping roll type manufacturing system of FIG. 1a or the cluster type manufacturing system of FIG. 1b. Though not shown in the drawings, since the process chambers of the roll-to-roll type manufacturing system are not separated from each other, process chambers for forming the first sub-layer 400a and the second sub-layer 400b may be required.

That is, in the stepping roll type manufacturing system, when the substrate 100 is transferred to one process chamber and is stopped, the gates of the process chamber are closed and the first sub-layer 400a and the second sub-layer 400b are deposited. On the other hand, in the roll-to-roll type manufacturing system, since the process chamber does not include gates, the first sub-layer 400a and the second sub-layer 400b should be deposited as the substrate is continuously transferred without stopping.

In order that the first sub-layer 400a and the second sub-layer 400b are deposited while the substrate 100 is continuously transferred without stopping, the roll-to-roll type manufacturing system may include a process chamber for depositing the first sub-layer 400a and a process chamber for depositing the second sub-layer 400b.

For example, the gas including the non-silicon element is continuously introduced at the first flow rate value "α" into the process chamber for depositing the first sub-layer 400a. The gas including the non-silicon element is continuously introduced at the second flow rate value "β" into the process chamber for depositing the second sub-layer 400b.

The roll-to-roll type manufacturing system may include the process chambers for a plurality of the first sub-layers 400a and the process chambers for a plurality of the second sub-layers 400b in order to form a plurality of the first sub-layers 400a and a plurality of the second sub-layers 400b. Here, the first flow rate values "α" of the gas including the non-silicon element introduced into two process chambers for forming two adjacent first sub-layers 400a may be different from each other. Also, the duration times of the first flow rate values "α" of the gas including the non-silicon element introduced into two process chambers for forming two adjacent first sub-layers 400a may be different from each other.

Likewise, the second flow rate values "β" of the gas including the non-silicon element introduced into two process chambers for forming two adjacent second sub-layers 400b may be different from each other. Also, the duration times of the second flow rate values "β". of the gas including the non-silicon element introduced into two process chambers for forming two adjacent second sub-layers 400b may be different from each other.

Figure 7:
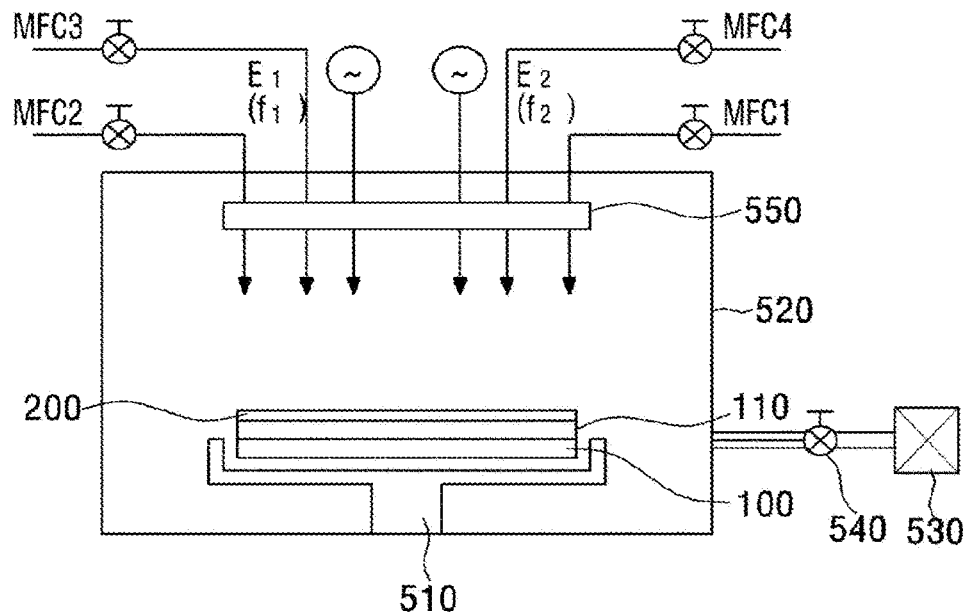
FIG. 7 shows another example of the plasma-enhanced chemical vapor deposition apparatus for forming the intermediate reflector in accordance with the embodiment of the present invention.

FIG. 7 shows a plasma-enhanced chemical vapor deposition apparatus for forming an intermediate reflector in accordance with an embodiment of the present invention. As shown in FIG. 7, a substrate 100 on which a first electrode 110 and a first unit cell 200 are formed is placed on a plate 510 functioning as an electrode.

After a second conductive silicon layer 250 of the first unit cell 200 is formed, gas including an non-silicon element such as oxygen, carbon or nitrogen is introduced into the process chamber 520 in a state where the flow rates of the hydrogen gas, silane gas, and impurity gas introduced into a process chamber 520, substrate temperature and process pressure, etc., are maintained.

As shown in FIG. 7, the gases are introduced into the process chamber 520 through mass flow controllers MFC1 to MFC3 and an electrode 550 having nozzles formed therein. The gas including the non-silicon element is introduced into the process chamber 520 through a mass flow controller MFC4 and nozzle of the electrode 550. Here, the flow rates of the gases introduced through the mass flow controllers MFC1 to MFC4 may be maintained constant.

When the gas including the non-silicon element is introduced and a first power source E1 and a second power source E2 supply a first voltage and a second voltage respectively, an electrical potential difference between the electrode 550 and the plate 510 makes the gases within the process chamber 520 become in a plasma state and then be deposited on the second conductive silicon layer 250 of the first unit cell 200. Accordingly, an intermediate reflector 400 is formed.

When the non-silicon element is oxygen, the intermediate reflector 400 includes an n-type hydrogenated nanocrystalline silicon oxide (n-nc-SiC:H). When the non-silicon element is carbon, the intermediate reflector 400 includes an n-type hydrogenated nanocrystalline silicon carbide (n-nc-SiC:H). When the non-silicon element is nitrogen, the intermediate reflector 400 includes an n-type hydrogenated nanocrystalline silicon nitride (n-nc-SiN:H).

As such, since the intermediate reflector 400 includes an n-type hydrogenated nanocrystalline silicon based material similar to the n-type hydrogenated nanocrystalline silicon of the unit cell on which light is first incident, the intermediate reflector 400 can be easily joined with the unit cell closest to the light incident side. That is, in the p-i-n type photovoltaic device, the second conductive silicon layer 250 of the first unit cell 200 may be composed of the n-type hydrogenated nanocrystalline silicon. Further, in the n-i-p type photovoltaic device, the second conductive silicon layer 250 of the first unit cell 200 is composed of the n-type hydrogenated nanocrystalline silicon.

Figure 8:
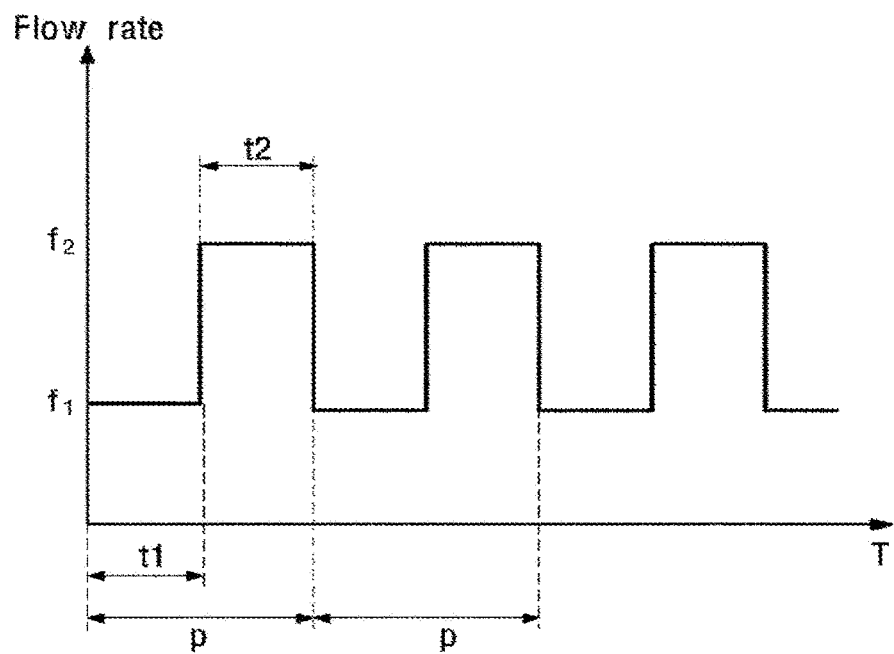
FIGS. 8 and 9 show frequency changes of a first power source and a second power source which are supplied to a process chamber for forming the intermediate reflector in accordance with the embodiment of the present invention.
Figure 9:
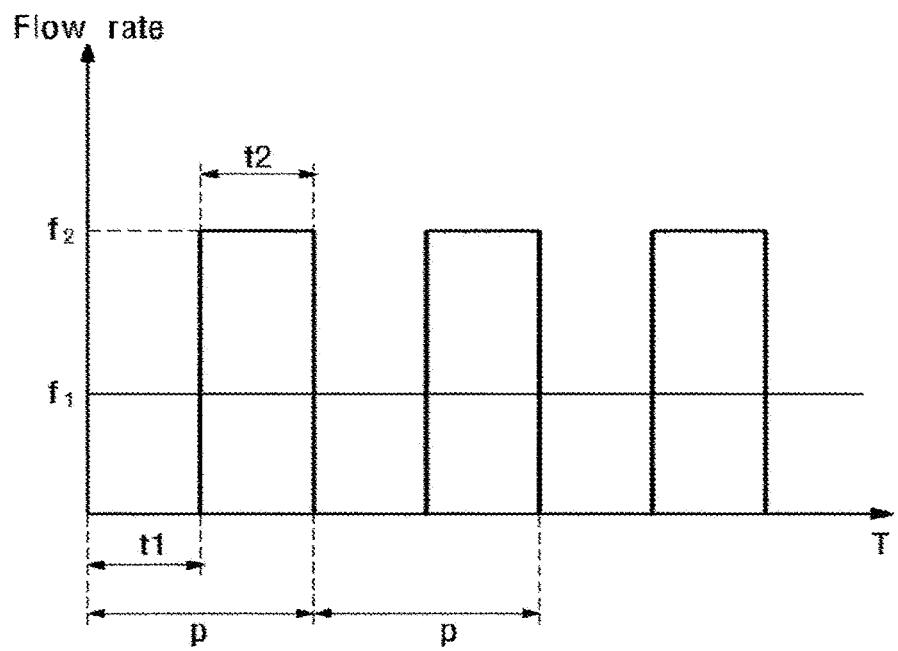

Frequency changes shown in FIGS. 8 and 9 can be used to form not only a portion of the intermediate reflector 400 but also the rest of the intermediate reflector 400.

FIGS. 8 and 9 show frequency changes of the first power source E1 and the second power source E2 which are supplied to the process chamber 520 for forming the intermediate reflector in accordance with the embodiment of the present invention.

In the embodiment of the present invention, the flow rate of the hydrogen, the flow rate of the silane and the flow rate of the gas including the non-silicon element are constant in accordance with the elapsed deposition time T. Here, as shown in FIG. 8, the first power source E1 and the second power source E2 are able to respectively alternately supply a first voltage with a first frequency f1 and a second voltage with a second frequency f2.

As shown in FIG. 9, the first power source E1 continuously supplies a voltage with the first frequency f1 in accordance with the elapsed deposition time T. The second power source E2 discontinuously supplies a voltage with the second frequency f2. That is, the second power source E2 repeatedly supplies and stops supplying the voltage.

When the first voltage and the second voltage having mutually different frequencies are supplied as shown in FIGS. 8 and 9, the intermediate reflector 400 including a plurality of sub-layers 400a and 400b is formed on the second conductive silicon layer 250 of the first unit cell 200.

Figure 10:
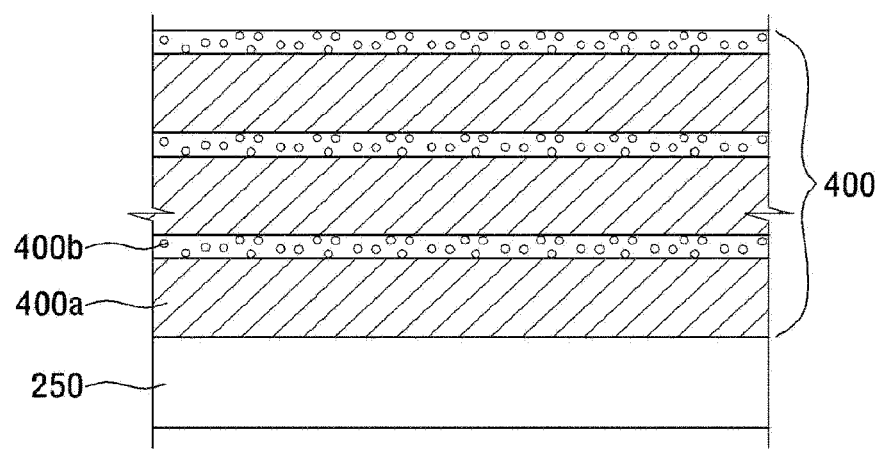
FIG. 10 shows the intermediate reflector included in the embodiment of the present invention.

When the flow rate of the gas including the non-silicon element such as oxygen, carbon or nitrogen changes as described in FIGS. 3 to 6b, or when the frequency of the power source changes as described in FIGS. 8 and 9, the intermediate reflector 400 including a plurality of the sub-layers 400a and 400b as shown in FIG. 10 is formed.

Here, when a ratio ea duration time t1 of the first flow rate value "a" to a duration time t2 of the second flow rate value "β" is constant, the intermediate reflector 400 may include at least one pair of a first sub-layer 400a and a second sub-layer 400b, and a thickness ratio between the first sub-layer and the second sub-layer in each of the pairs is constant as shown in FIG. 10.

As shown in FIG. 8, a ratio of a duration time t2 for supplying the second voltage with the second frequency f2 to a duration time t1 for supplying the first voltage with the first frequency f1 is constant. As shown in FIG. 9, a ratio of a duration time for supplying the second voltage with the second frequency f2 to a duration time for stopping supplying the second voltage with the second frequency t2, i.e., the duration time t1 for supplying only the first voltage is constant. Hence, a thickness ratio between the first sub-layer 400a and the second sub-layer 400b in each of the pairs is constant.

Since the flow rate "A" of the hydrogen and the flow rate "B" of the silane are constant in accordance with the elapsed deposition time T as shown in the flow rate changes and frequency changes of FIGS. 3 to 9, a hydrogen dilution ratio, i.e., a ratio of the flow rate of the hydrogen to the flow rate of the silane is constant.

The non-silicon element prevents crystallization. Therefore, when the flow rate of the gas including the non-silicon element is changed, the sub-layers having mutually different crystal volume fractions are formed. In other words, the crystal volume fraction of the first sub-layer 400a formed during a time period for supplying the gas including the non-silicon element at the first flow rate value "α" greater than the second flow rate value "β" is less than that of the second sub-layer 400b formed during a time period for supplying the gas including the non-silicon element at the second flow rate value "α".

As the frequency of the voltage supplied to the process chamber 520 becomes lower, crystallinity and deposition rate decreases. As the frequency of the voltage supplied to the process chamber 520 becomes higher, the crystallinity and the deposition rate increases. Therefore, the first sub-layer 400a and the second sub-layer 400b having mutually different crystal volume fractions are formed. The crystal volume fraction of the first sub-layer 400a is smaller than that of the second sub-layer 400b.

With regard to the nanocrystalline silicon based material, the crystal volume fraction of the nanocrystalline silicon based material can be obtained through the following equation using an area of a component peak obtained by Raman spectroscopy.

$$\text{crystal volume fraction (\%)} = [(A_{510} + A_{520})/(A_{480} + A_{510} + A_{520})] * 100$$

Here, $A_i$ means an area of a component peak in the vicinity of i cm$^{-1}$.

As the crystal volume fraction becomes lower due to either the increase of the flow rate of the gas including the non-silicon element or the reduction of the frequency, a refractive index of the sub-layer is reduced as well. Accordingly, a refractive index of the first sub-layer 400a having a crystal volume fraction less than that of the second sub-layer 400b is less than the refractive index of the second sub-layer 400b.

When the gas including the non-silicon element is not supplied during the time t2 as shown in FIGS. 3 to 6b, in other words, When the second flow rate value "β" is 0, the second sub-layer 400b may be composed of the hydrogenated nanocrystalline silicon (nc-Si:H).

As such, since the sub-layers 400a and 400b having mutually different crystal volume fraction or refractive indices are alternately stacked, and each of the sub-layers 400a and 400b functions as a waveguide, reflection of light with a particular wavelength, which is absorbed by a unit cell on which light is first incident among a plurality of the unit cells, can be selectively maximized by the intermediate reflector 400.

Here, the second sub-layer 400b having a relative large crystal volume fraction improves a vertical conductivity, thereby making it possible to allow electric current to easily flow between the first unit cell 200 and the second unit cell 300. The refractive index of the first sub-layer 400a is less than that of the second sub-layer 400b and is matched to the refractive index of the light incident unit cell. Thereby the first sub-layer 400a increases the reflection of light with a short wavelength which has high energy density, for example, light with a wavelength from 500 nm to 700 nm.

Meanwhile, as described above, in the embodiment of the present invention, the hydrogen dilution ratio and the pressure of the process chamber 520 are constant. Since the flow rates of the hydrogen and silane which are supplied into the process chamber 520 are greater than the flow rate of the gas including the non-silicon element, controlling the flow rates of the hydrogen and silane are relatively more difficult than controlling the flow rate of the gas including the non-silicon element. Additionally, turbulences of the hydrogen and silane may be generated in the process chamber 520 due to the introduction of the hydrogen and silane.

Therefore, when the flow rates of the hydrogen and silane are constant, controlling the gas including the non-silicon element having a small flow rate is easy, and a possibility that turbulences of the hydrogen and silane are generated within the process chamber 520 is reduced. As a result, the thickness uniformity of the intermediate reflector 400 is improved.

In the embodiment of the present invention, the total thickness of the intermediate reflector 400 is equal to or larger than 20 nm and equal to or less than 200 nm. When the thickness of the intermediate reflector 400 is equal to or larger than 20 nm, the refractive index of the light incident unit cell is matched to the refractive index of the intermediate reflector 400, so that internal reflection can easily occur. In addition, when the thickness of the intermediate reflector 400 is equal to or less than 200 nm, the excessive light absorption by the intermediate reflector 400 due to the thickness increase is prevented.

The thickness of each of the first sub-layer 400a and the second sub-layer 400b is equal to or larger than 10 nm and equal to or less than 50 nm. When the thicknesses of the first sub-layer 400a and the second sub-layer 400b are equal to or larger than 10 nm, refractive index matching is accomplished and sufficient crystalline silicon grains are formed. When the thickness of either the first sub-layer 400a or the second sub-layer 400b is larger than 50 nm, the sub-layer becomes so thick that the number of sub-layers included in the intermediate reflector 400 is reduced. As a result, internal reflection by the intermediate reflector 400 might be reduced. Therefore, when the thickness of each of the first sub-layer 400a and the second sub-layer 400b is equal to or less than 50 nm, the intermediate reflector 400 includes an appropriate number of sub-layers, so that light can be easily reflected.

Meanwhile, the refractive index of the intermediate reflector 400 including the first sub-layer 400a and the second sub-layer 400b is equal to or greater than 1.7 and equal to or less than 2.5 at a wavelength range from 500 nm to 700 nm. When the refractive index of the intermediate reflector 400 is equal to or greater than 1.7, conductivity thereof increases, a fill factor (FF) of a multi-junction photovoltaic device is improved and efficiency is increased. When the refractive index of the intermediate reflector 400 is equal to or less than 2.5, light with a wavelength range from 500 nm to 700 nm is easily reflected and the short circuit current of the first unit cell increases. As a result, the efficiency is enhanced.

An average content of the non-silicon element contained in the intermediate reflector 400 is equal to or more than 10 atomic % and equal to or less than 40 atomic %. When the average content of the non-silicon element is equal to or more than 10 atomic %, the refractive index of the light incident unit cell is matched to the refractive index of the intermediate reflector 400, so that internal reflection can easily occur.

When the average content of the non-silicon element is unnecessarily large, the vertical electrical conductivity of the sub-layers may decrease since the crystal volume fractions thereof are reduced. Accordingly, in the embodiment of the present invention, when the average content of the non-silicon element is equal to or less than 40 atomic %, the average crystal volume fraction of the intermediate reflector 400 is appropriately maintained and it prevents the intermediate reflector 400 from getting amorphous.

The average hydrogen content of the intermediate reflector 400 is equal to or more than 10 atomic % and equal to or less than 25 atomic %. When the average hydrogen content of the intermediate reflector 400 is equal to or more than 10 atomic %, the film quality of the intermediate reflector 400 is improved since the dangling bonds are passivated. When the average hydrogen content of the intermediate reflector 400 is unnecessarily large, the electrical conductivity is degraded since the crystal volume fraction of the intermediate reflector 400 is reduced. Accordingly, when the average hydrogen content of the intermediate reflector 400 is equal to or less than 25 atomic %, the vertical electrical conductivity is increased since it prevents the intermediate reflector 400 from getting amorphous caused by the decrease of the crystal volume fraction.

The crystal volume fraction of the intermediate reflector 400 is equal to or greater than 4% and equal to or less than 30%. When the crystal volume fraction of the intermediate reflector 400 is equal to or greater than 4%, the tunnel junction property can be improved. When the crystal volume fraction of the intermediate reflector 400 is equal to or less than 30%, the refractive index matching characteristics can be prevented from being degraded since the non-silicon material content is maintained.

Meanwhile, when the intermediate reflector 400 according to the embodiment of the present invention is composed of the n-type nanocrystalline silicon based material having an excellent vertical electrical conductivity, the intermediate reflector 400 can replace the n-type silicon layer of the unit cell on which light is first incident.

For example, when the first unit cell 200 includes the p-type silicon layer, the intrinsic silicon layer and the intermediate reflector 400 composed of the n-type nanocrystalline silicon based material, which are sequentially stacked from the substrate 100, and when the second unit cell 300 includes the p-type silicon layer, the intrinsic silicon layer and the n-type silicon layer, which are sequentially stacked from the intermediate reflector 400, the intermediate reflector 400 can function as the n-type silicon layer of the first unit cell 200 on which light is incident.

Moreover, when the first unit cell 200 includes the n-type silicon layer, the intrinsic silicon layer and the p-type silicon layer, which are sequentially stacked from the substrate 100, and when the second unit cell 300 includes the intermediate reflector 400 composed of the n-type nanocrystalline silicon based material, the intrinsic silicon layer and the p-type silicon layer, which are sequentially stacked from the first unit cell 200, the intermediate reflector 400 can function as the n-type silicon layer of the second unit cell 300 on which light is incident.

Accordingly, when the intermediate reflector 400 is composed of the n-type nanocrystalline silicon based material, a unit cell on which light is first incident among both the first unit cell 200 and the second unit cell 300 includes the p-type silicon layer and the intrinsic silicon layer, and the intermediate reflector 400 is able to contact with the intrinsic silicon layer.

Figure 11:
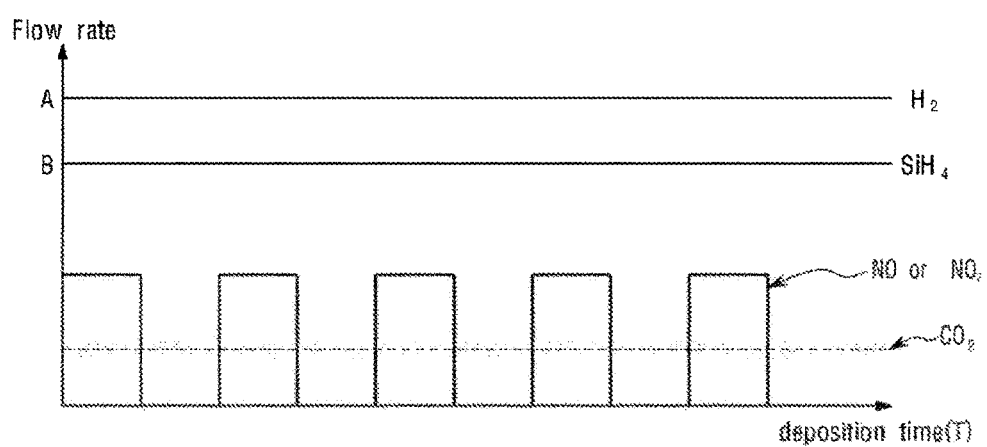
FIG. 11 shows a flow rate change of gas including a non-silicon element for forming the intermediate reflector in accordance with another embodiment of the present invention.

FIG. 11 shows a flow rate change of gas including a non-silicon element for forming intermediate reflector in accordance with another embodiment of the present invention.

As shown in FIG. 11, the flow rate "A" of hydrogen, the flow rate "B" of silane and the flow rate (not shown) of impurity are constant. Here, the flow rate of gas including a first non-silicon element such as NO or $NO_2$ alternately varies between the first flow rate value "α" and the second flow rate value "β(=0)". The flow rate of gas including a second non-silicon element such as carbon dioxide ($CO_2$) is less than the first flow rate value "α" and greater than 0.

Accordingly, while the gas including the first min-silicon element such as NO or $NO_2$ is supplied at the first flow rate value "α", the first sub-layer 400a including a hydrogenated nanocrystalline silicon oxide nitride (nc-SiON:H) including both oxygen and nitrogen is formed.

Further, while the gas including the first non-silicon element such as NO or $NO_2$ is stopped being supplied at the second flow rate value "β(=0)", and while the gas including the second non-silicon element such as carbon dioxide is supplied, the second sub-layer 400b including a hydrogenated nanocrystalline silicon oxide (n-nc-SiO:H) is formed.

The gas including the non-silicon element allows the refractive index of the intermediate reflector 400 including the first and the second sub-layers 400a and 400b to be matched to that of the light incident unit cell. The vertical electrical conductivity between the unit cells is improved by the crystalline silicon grains.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for manufacturing a photovoltaic device, the method comprising:
   forming a first electrode on a substrate;
   forming a first unit cell on the first electrode;
   forming a portion of an intermediate reflector on the first unit cell in a first manufacturing system, the intermediate reflector including a plurality of first and second sub-layers alternately stacked;
   exposing to the air the substrate on which the portion of the intermediate reflector is formed;
   forming the rest of the intermediate reflector in a second manufacturing system, the intermediate reflector including the plurality of the first and second sub-layers alternately stacked;
   forming a second unit cell on the intermediate reflector; and
   forming a second electrode on the second unit cell.

2. The method of claim 1, wherein two adjacent sub-layers among the plurality of the first and second sub-layers alternately stacked have mutually different refractive indices or mutually different crystal volume fractions.

3. The method of claim 2, wherein the plurality of the first and second sub-layers are formed by alternately changing a flow rate of gas including a non-silicon element between a first flow rate value and a second flow rate value in accordance with the elapsed deposition time.

4. The method of claim 2, wherein the plurality of the first and second sub-layers are formed by alternately supplying voltages having mutually different first frequency and second frequency to a process chamber.

5. The method of claim 2, wherein, when the portion of the intermediate reflector and the rest of the intermediate reflector are formed, an impurity is introduced into a process chamber.

6. The method of claim 2, wherein, after the substrate is exposed to the air, the portion of the intermediate reflector is etched in the second manufacturing system.

7. The method of claim 6, wherein the etching is performed in a process chamber in which the rest of the intermediate reflector is formed.

8. The method of claim 6, wherein the portion of the intermediate reflector is etched by using hydrogen plasma.

9. The method of claim 6, wherein an impurity is introduced at the time of the etching process.

10. The method of claim 6, wherein, the etching process, the formation of the rest of the intermediate reflector and the formation of a first conductive silicon layer of the second unit cell are performed in a process chamber while a process pressure of the process chamber is maintained constant.

11. The method of claim 2, wherein the intermediate reflector is formed such that a concentration of a non-silicon element contained in the plurality of the first and second sub-layers respectively increases more the farther it is from a light incident side.

12. The method of claim 2, wherein, when the intermediate reflector is composed of an n-type nanocrystalline silicon based material, a unit cell closer to a light incident side between the first unit cell and the second unit cell includes a p-type silicon layer and an intrinsic silicon layer, and wherein the intermediate reflector is formed contacting with the Intrinsic silicon layer.

13. The method of claim 2, wherein the intermediate reflector is formed in a plurality of process chambers.

* * * * *